US010234993B2

(12) United States Patent
Lee

(10) Patent No.: US 10,234,993 B2
(45) Date of Patent: Mar. 19, 2019

(54) TOUCH SYSTEM FOR PREVENTING WATER INFLUENCE

(71) Applicant: Feeling Technology Corp., Chupei, Hsinchu County (TW)

(72) Inventor: Kun-Hsu Lee, Chupei (TW)

(73) Assignee: ADVANCED ANALOG TECHNOLOGY, INC., Zhubei, Hsinchu County (TW)

(*) Notice: Subject to any disclaimer, the term of this patent is extended or adjusted under 35 U.S.C. 154(b) by 0 days.

(21) Appl. No.: 15/489,110

(22) Filed: Apr. 17, 2017

(65) Prior Publication Data

US 2018/0253186 A1 Sep. 6, 2018

(30) Foreign Application Priority Data

Mar. 3, 2017 (TW) .............................. 106107035 A

(51) Int. Cl.
*G06F 3/044* (2006.01)
*G06F 3/041* (2006.01)
*H03K 17/96* (2006.01)

(52) U.S. Cl.
CPC ............ *G06F 3/0418* (2013.01); *G06F 3/044* (2013.01); *H03K 17/9622* (2013.01); *G06F 2203/04107* (2013.01); *H03K 2217/960705* (2013.01)

(58) Field of Classification Search
None
See application file for complete search history.

(56) References Cited

U.S. PATENT DOCUMENTS

2012/0050214 A1* 3/2012 Kremin ................. G06F 3/0418
345/174
2016/0306491 A1* 10/2016 Lee ..................... G06F 3/04883

* cited by examiner

*Primary Examiner* — Brian M Butcher
(74) *Attorney, Agent, or Firm* — Muncy, Geissler, Olds & Lowe, P.C.

(57) ABSTRACT

A touch system includes a circuit board, touch pads, a control chip and an insulation board. The circuit board has a conductive board body including configuration regions. The touch pads is spaced from the configuration regions by the conductive board body. Each touch pad includes at least one touch portion. The control chip includes a multiplex module coupling the touch pads and an oscillation control module coupling the conductive board body. The oscillation control module conducts alternately the multiplex module and every touch portions to utilize a work voltage for generating a voltage oscillation wave respective to each conducted touch portion. The voltage oscillation wave is transmitted to the conductive board body. When an ion-contained liquid is on the insulation board by covering partly the conductive board body and the touch portion, a capacitance effect therebetween is forming by the work voltage, but further erased by the voltage oscillation wave.

5 Claims, 4 Drawing Sheets

TOUCH SYSTEM FOR PREVENTING WATER INFLUENCE

This application claims the benefit of Taiwan Patent Application Serial No. 106107035, filed Mar. 3, 2017, the subject matter of which is incorporated herein by reference.

BACKGROUND OF THE INVENTION

1. Field of the Invention

The invention relates to a touch system for preventing water influence, and more particularly to the touch system for preventing water influence that applies equipotentials to avoid capacitance effect or uses division voltages to judge if or not the instant touch is valid.

2. Description of the Prior Art

As the technology progresses rapidly, prosperity of networking has made people's daily life filled with various electronic devices, such as washing machines, microwaves, outdoor coded locks and the like electronic devices. In particular, most of these electronic devices are improved to adopt touch-keys. Generally speaking, the touch-keys are formed by constructing a plurality of touch pads on a printed circuit board (PCB) so as thereby to account for performing corresponding keys and/or functional keys of an electronic device.

Currently, most of the conventional touch pads are not waterproof, from which some notorious situations may be met during the daily usage. For example, in the case that a washing machine is located in a balcony, then, as a raindrop hits any of the touch pads of the washing machine, an IC chip on the printed circuit board and electrically coupling the touch pads may misjudge and command the washing machine to execute a ghost operation. As a result, excessive energy consumption and unnecessary machine operation would be inevitable. Thus, any improvement thereupon is definitely welcome to the art.

SUMMARY OF THE INVENTION

In view of current technology, while a water drop falls right at a touch pad, the IC chip may not be able to judge if the touch upon the touch pad is made by a human or a raindrop. Therefore, it is a problem of the current electronic device that the conventional touch pads would lead to excessive energy consumption and unnecessary machine operation. Accordingly, it is an object of the present invention to provide a touch system for preventing water influence, that can erase the capacitance effect resulted from the ion-contained liquid by applying equipotentials or division voltages and further by integrating the PCB structure to determine easily whether or not the touch is valid.

In the present invention, the touch system configured for preventing water influence includes a circuit board, a plurality of touch pads, a control chip and an insulation board. The circuit board has a conductive board body further including a plurality of configuration regions distributed in an arrangement direction. The plurality of touch pads are located on the circuit board in the corresponding configuration regions, by being spaced with the conductive board body. Each of the touch pads includes at least one touch portion. The control chip, mounted on the circuit board, further includes a multiplex module and an oscillation control module. The multiplex module is electrically coupled with the plurality of touch pads. The oscillation control module, electrically coupled with the multiplex module and the conductive board body, bases on a scan time to conduct alternately the multiplex module and every touch portions of each of the touch pads so as to utilize a work voltage for generating a corresponding voltage oscillation wave respective to each the touch portion that is conducted, and the voltage oscillation wave is further transmitted to the conductive board body. The insulation board is to cover at least part of the conductive board body. When an ion-contained liquid is on the insulation board by covering at least part of the conductive board body and the touch portion of one of the touch pads, a capacitance effect between the conductive board body and the touch portion of one of the touch pads is fainted by the work voltage. Then, the voltage oscillation wave is applied to erase the capacitance effect.

In one embodiment of the present invention, the touch system can be further configured as follows. In the case that each the touch pad includes a plurality of the at least one touch portion, at least two of the touch portions of each the touch pad are electrically coupled together by a coupling wire and further electrically coupled with the multiplex module. The at least two of the touch portions of each the touch pad are distributed diagonally. The at least one touch portion is one of a circle, an oval, a sector and a polygon. In addition, the configuration region is one of a circle, an oval, a sector and a polygon.

In another aspect of the present invention, the touch system includes a circuit board, a plurality of touch pads, a control chip and an insulation board. The circuit board has a conductive board body further including a plurality of configuration regions distributed in an arrangement direction. The plurality of touch pads are located on the circuit board in the corresponding configuration regions by being spaced with the conductive board body. A touch-pad capacitor is formed between the plurality of touch pads and the conductive board body after a work voltage is received. Each of the touch pads includes at least one touch portion. The control chip, mounted on the circuit board, further includes a work voltage-providing module, a multiplex module, a capacitor and a control module. The work voltage-providing module, electrically coupled with the conductive board body, is to provide the work voltage to the conductive board body. The multiplex module is electrically coupled with the plurality of touch pads. The capacitor has a first node and a second node. The first node is electrically coupled with the multiplex module, while the second node is grounded. The control module, electrically coupled with the multiplex module and the first node of the capacitor, has a voltage difference-judged value. The control module bases on a scan time to conduct alternately between the multiplex module and the touch portion of each of the plurality of touch pads so as to have the work voltage to be divided into a division voltage at the first node through the touch-pad capacitor and the capacitor. The insulation board covers at least part of the conductive board body. When an ion-contained liquid is on the insulation board by covering at least part of the conductive board body and the touch portion of one of the touch pads, a liquid-bridging capacitor is formed between the conductive board body and the one of the touch pads by being parallel with the touch-pad capacitor so as thereby to magnify the division voltage into a magnified division voltage. If the control module judges that the magnified division voltage is larger than the voltage difference-judged value, the control module outputs an invalid touch signal.

In one embodiment of the present invention, the touch system can be further configured as follows. The control module having a ratio judged value can further base on the magnified division voltage and the voltage difference judged value to calculate a variation ratio. While the variation ratio reaches the ratio judged value, the control module outputs an invalid touch signal. In the case that each the touch pad includes a plurality of the at least one touch portion, at least two of the touch portions of each the touch pad are electrically coupled together by a coupling wire and further electrically coupled with the multiplex module. In addition, the at least two of the touch portions of each the touch pad are distributed diagonally. The at least one touch portion is one of a circle, an oval, a sector and a polygon. Also, the configuration region is one of a circle, an oval, a sector and a polygon.

After adopting the touch system of the present invention, the induced capacitor caused by an accidental water drop on the touch pad can be erased by an equipotential manipulation, and also the determination upon whether the touch is a pure hand touch or a water touch can be ensured by judging the corresponding division voltage. Thereupon, mis-touch at the IC chip so as further to execute unexpected functions can be thus avoided, and therefore the operability of the touch system can be substantially enhanced.

All these objects are achieved by the touch system for preventing water influence described below.

BRIEF DESCRIPTION OF THE DRAWINGS

The present invention will now be specified with reference to its preferred embodiment illustrated in the drawings, in which.

DESCRIPTION OF THE PREFERRED EMBODIMENT

The invention disclosed herein is directed to a touch system for preventing water influence. In the following description, numerous details are set forth in order to provide a thorough understanding of the present invention. It will be appreciated by one skilled in the art that variations of these specific details are possible while still achieving the results of the present invention. In other instance, well-known components are not described in detail in order not to unnecessarily obscure the present invention.

According to the present invention, various embodiments of the touch system for preventing water influence can be organized, but cannot be all elucidated herein. Alternatively, two of them are preferably raised for explaining details of the present invention.

Figure 1:
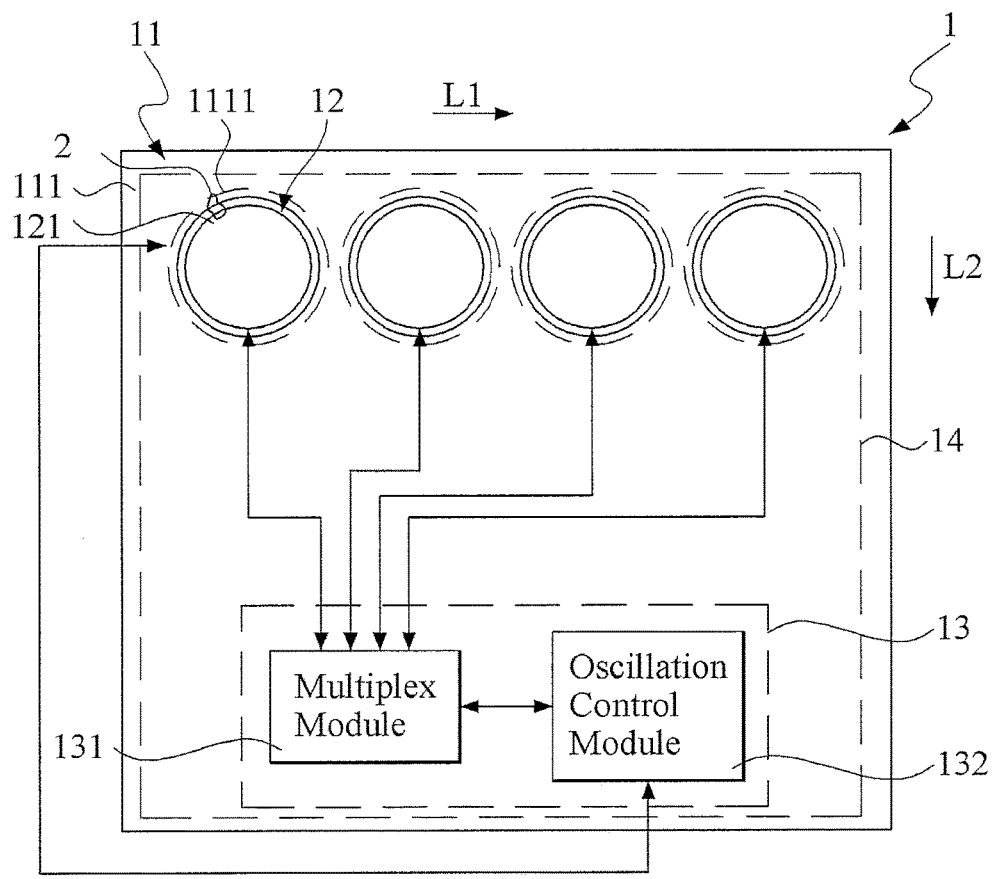
FIG. 1 is a schematic view of a first embodiment of the touch system for preventing water influence in accordance with the present invention.
Figure 2:
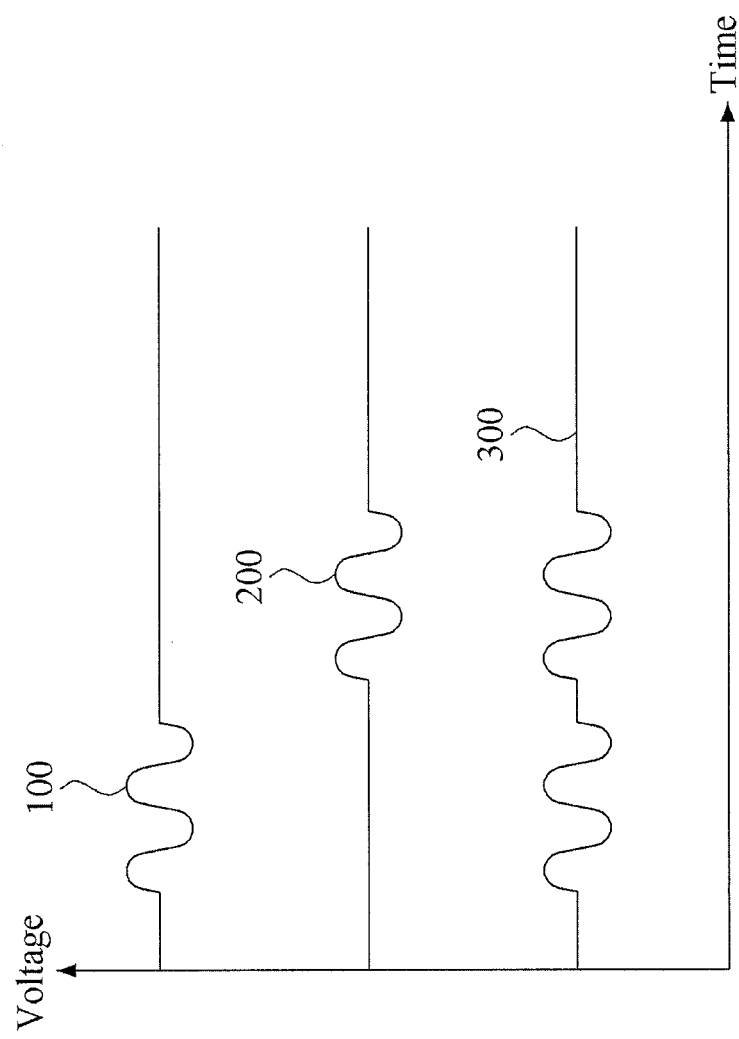
FIG. 2 is a schematic view of voltage oscillation waves of the first embodiment of FIG. 1.

Refer now to FIG. 1 and FIG. 2; where FIG. 1 is a schematic view of a first embodiment of the touch system configured for preventing water influence in accordance with the present invention, and FIG. 2 is a schematic view of voltage oscillation waves of the first embodiment of FIG. 1.

As shown, the first embodiment 1 of the touch system 1 is configured for preventing water influence, and includes a circuit board 11, a plurality of touch pads 12, a control chip 13 and an insulation board 14. The circuit board 11 is furnished with a conductive board body 111 having a plurality of configuration regions 1111 arranged in an arrangement direction L1 and another arrangement direction L2. In the present invention, the configuration region 1111 can be, but not limited to, a circle, an oval, a sector or a polygon.

In addition, it shall be noted that, in this first embodiment, the circuit board 11 has only one conductive board body 111. However, in some other embodiments, the circuit board 11 can include a plurality of the conductive board bodies 111 connected together. In addition, in this first embodiment, the plurality of configuration regions 1111 are only aligned in the arrangement direction L1 (namely, the configuration regions 1111 are arranged in a single row). However, in some other embodiments, the plurality of configuration regions 1111 may be arranged in other patterns.

Figure 3:
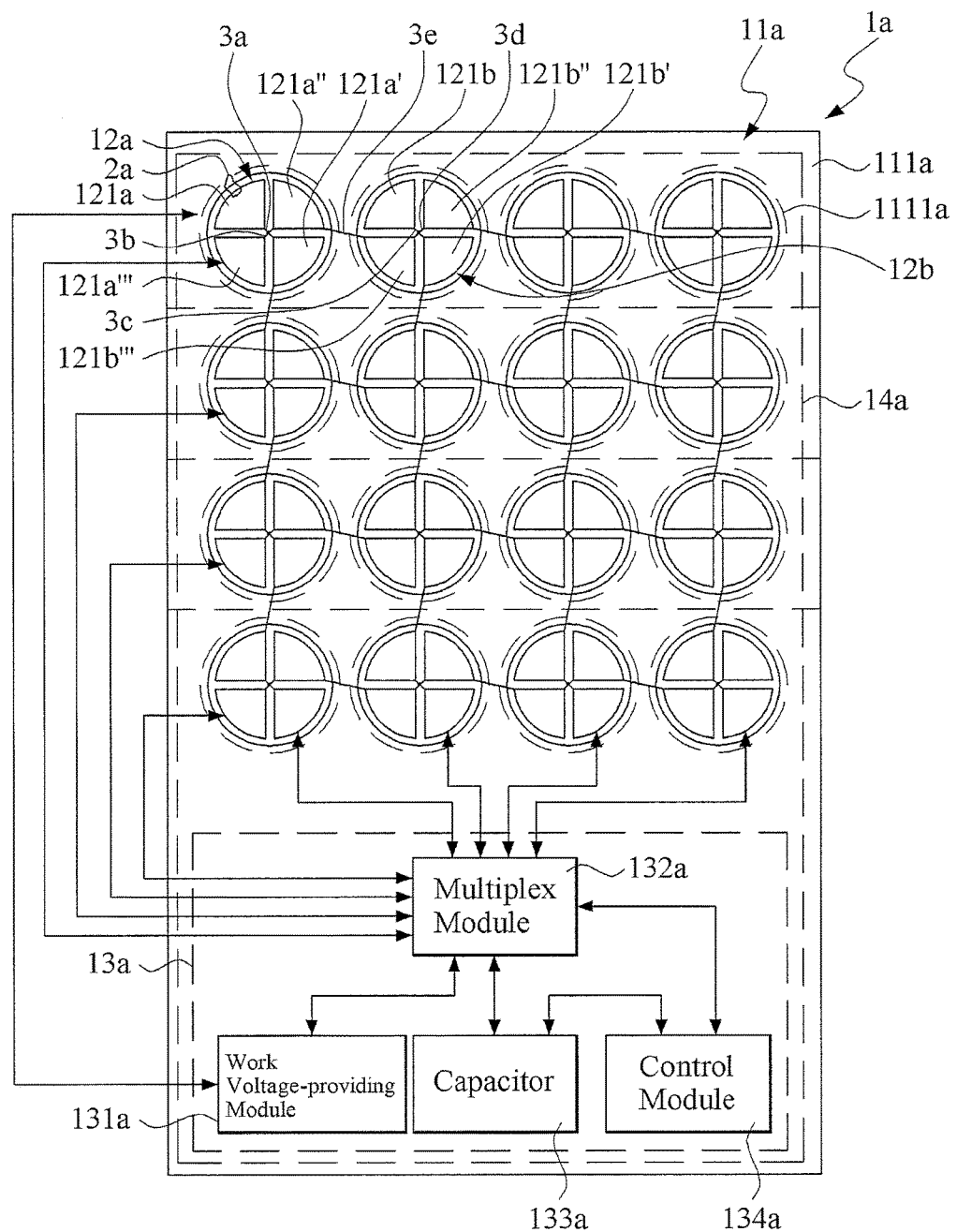
FIG. 3 is a schematic view of a second embodiment of the touch system for preventing water influence in accordance with the present invention.

The plurality of touch pads 12 located on the circuit board are individually arranged into the corresponding configuration regions 1111, but are isolated from the conductive board body 111. Each of the touch pads 12 includes at least one touch portion 121, and the touch portion 121 can be shaped to be, but not limited to, a circle, an oval, a sector (for example, a quarter circle or an eighth circle) or a polygon (for example, a triangle or a rectangle). It shall be noted that, in this first embodiment, each of the touch pads 12 includes only one touch portion 121. However, in some other embodiments, the touch pad 12 may include more than two touch portions 121. For example, in the second embodiment as shown in FIG. 3, more than two touch portions 121 are included.

The control chip 13, located on the circuit board 11, includes a multiplex module 131 and an oscillation control module 132. The multiplex module 131, electrically coupled with the touch portions 121 of the plurality of touch pads 12, can be an existing multiplexer.

The oscillation control module 132, electrically coupled with the multiplex module 131 and the conductive board body 111, can be an existing circuit including a relaxation oscillator and a micro processing unit, in which the oscillator includes generally a voltage source, a switch, a comparator and other components. All of these components can be found in the marketplace, and thus details thereabout are omitted herein.

The oscillation control module 132 is to base on a scan time (controlled by the aforesaid micro processing unit, already a mature art, and thus omitting details thereabout) to conduct individually the touch portions 121 of each of the touch pads 12 with the multiplex module 131 in an alternate way. For example, when the oscillation control module 132 conducts the multiplex module 131 with the labeled touch portion 121 of touch pad 12 in the figure, a work voltage generated by the voltage source in the oscillation control module 132 would energize the capacitor of the touch portion 121 of the touch pad 12, and discharge through switches and related components. Namely, the oscillation control module 132 utilizes the work voltage to generate a voltage oscillation wave (for example, the waveform 100 or 200 shown in FIG. 2) respective to the corresponding energized touch portion 121. The voltage oscillation wave 100 or 200 is then forwarded to the conductive board body 111. It shall noted that the waveform 300 in FIG. 2 is a combination of the voltage oscillation waves 100 and 200. The voltage oscillation waves 100 and 200 are outputted at different scan times.

The insulation board 14 for covering at least part of the conductive board body 111, preferably all the touch pads 12, can be, but not limited to, an acrylic board or a glass board.

When an ion-contained liquid 2 on the insulation board 14 is spaced by the insulation board 14 to cover at least part of the conductive board body 111 and the touch portion 121 of one of the aforesaid touch pads 12, a capacitance effect is formed between the conductive board body 111 and the aforesaid one of the touch pads 12 by utilizing the work voltage. On the other hand, the voltage oscillation wave is applied to erase the capacitance effect.

In practice, the ion-contained liquid 2 can be water, and the work voltage would form a touch-pad capacitor between the conductive board body 111 and the specific touch portion 121. If the ion-contained liquid 2 bridges directly the conductive board body 111 and one specific touch portion 121, a liquid-bridging capacitor would be formed. Such a liquid-bridging capacitor is in parallel with the touch-pad capacitor, and would lead to a misjudged touch. In this present invention, since voltages at both ends of the liquid-bridging capacitor (crossing the conductive board body 111 and the touch portion 121) are established by the same voltage oscillation wave, thus the introduction of the voltage oscillation wave would erase the aforesaid capacitance effect of the liquid-bridging capacitor in an equipotential means.

In addition, it shall be noted that this first embodiment of the present invention adopts the capacitor-type touch control. Hence, if the ion-contained liquid 2 on the insulation board 14 can be positioned properly between the conductive board body 111 and the respective touch portion 121 of one of the touch pads 12, then a corresponding capacitance effect would be induced between the conductive board body 111 and the respective touch portion 121 of one of the touch pads 12.

Figure 4:
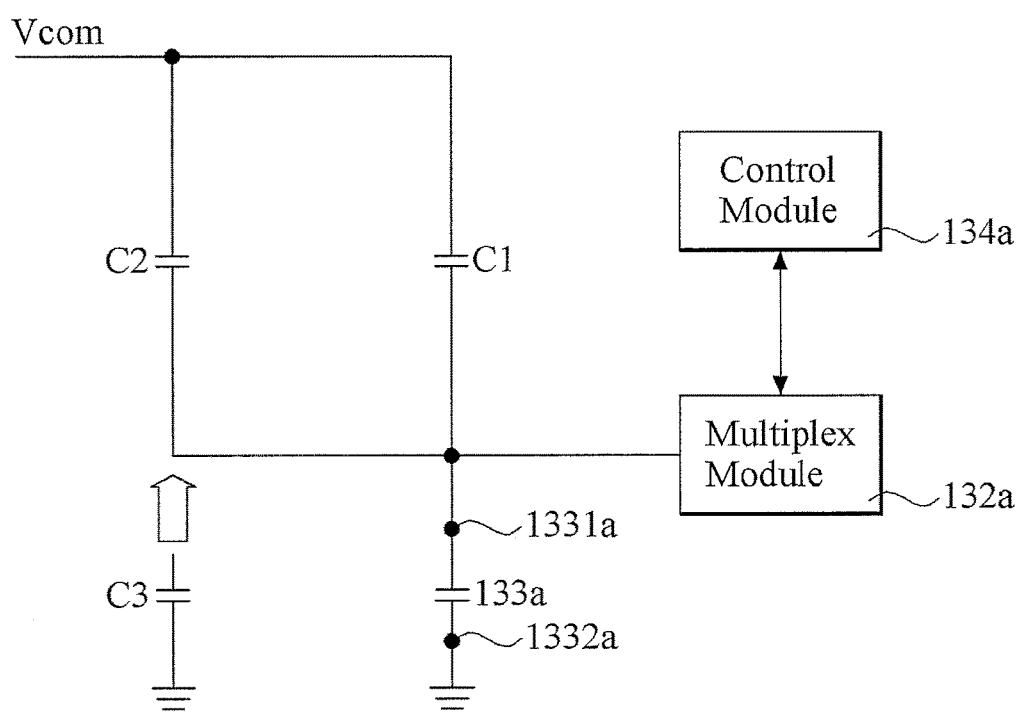
FIG. 4 is a schematic view of a circuit for the second embodiment of FIG. 3.

Refer now to FIG. 3 and FIG. 4; where FIG. 3 is a schematic view of a second embodiment of the touch system for preventing water influence in accordance with the present invention, and FIG. 4 is a schematic view of a circuit for the second embodiment of FIG. 3. As shown, the second embodiment of the touch system 1a is configured for preventing water influence, and includes a circuit board 11a, a plurality of touch pads 12a and 12b, a control chip 13a and an insulation board 14a. In this embodiment, since the circuit board 11a is structurally and functionally the same as that of the first embodiment, thus details thereabout are omitted herein.

As shown, the plurality of touch pads 12a and 12b on the circuit board 11a are located individually in the plurality of corresponding configuration regions 1111a, and are isolated from the conductive board body 111a. After the conductive board body 111a receives a work voltage, a touch-pad capacitor C1 is then formed between the conductive board body 111a and the conductive board body 111a. The touch pad 12a includes at least one touch portion (four 121a, 121a', 121a" and 121a'" in an array arrangement shown in FIG. 3), and the touch pad 12b also includes at least one touch portion (four 121b, 121b', 121b" and 121b'" in an array arrangement shown in FIG. 3).

The touch portions 121a and 121a' are distributed diagonally, while the touch portions 121a" and 121a'" are also distributed diagonally. In addition, the touch portions 121a and 121a' are electrically coupled by a coupling wire 3a so as to form a pair, and the pair of the touch portions 121a and 121a' are further electrically coupled with the touch pad located at the upper left corner of the lower touch pads by another coupling wire (not labeled in the figure). On the other hand, the touch portions 121a" and 121a'" form another pair, and this pair of the touch portions 121a" and 121a'" are electrically coupled together by another coupling wire 3b. It shall be noted that, in FIG. 3, the coupling wire 3b is to cross over, but not touch, the coupling wire 3a.

In addition, the touch portions 121b and 121b' are distributed diagonally, while the touch portions 121b" and 121b'" are also distributed diagonally. Namely, the touch portions 121b and 121b' are a pair, and a coupling wire 3c is applied to electrically couple these two touch portions 121b and 121b' so as to present a transversal distribution.

The touch portions 121b" and 121b'" form another pair, and another coupling wire 3d is applied to electrically couple these two touch portions 121b" and 121b'". A coupling wire 3e is applied to electrically couple the pair of the touch portions 121b" and 121b'" with the touch portion 121a" so as to present a horizontal distribution. In the present invention, all other wirings to couple electrically the touch portions are resembled to the aforesaid coupling patterns, and thus details thereabout are omitted herein.

The control chip 13a, mounted on the circuit board 11a, includes a work voltage-providing module 131a, a multiplex module 132a, a capacitor 133a and a control module 134a.

The work voltage-providing module 131a, electrically coupled with the conductive board body 111a, can be an existing voltage source for providing the work voltage to the conductive board body 111a. Namely, in comparison with the first embodiment, the work voltage-providing module 131a of the second embodiment is to provide the work voltage directly to the conductive board body 111a, not indirectly to the conductive board body 111a after the voltage oscillation wave is generated. It shall be explained that the work voltage provided by the work voltage-providing module 131a can be a waveform ranged from a voltage-low level to a voltage-high level (Vdd).

The multiplex module 132a, electrically coupled with the plurality of touch pads 12a and 12b, any existing multiplexer. The capacitor 133a has a first node 1331a and a second node 1332a, in which the first node 1331a is electrically coupled with the multiplex module 132a and the second node 1332a is grounded. The multiplex module 132a is also electrically coupled with the work voltage-providing module 131a so as to utilize the work voltage.

The control module 134a, electrically coupled with the multiplex module 132a and the first node 1331a of the capacitor 133a, is set to have a voltage difference-judged value and a ratio judged value, and can be an existing micro processing unit. Hence, in this second embodiment, the output of the voltage oscillation wave to the conductive board body 111a for erasing the capacitance effect by equipotentials does not go through the oscillator anymore, but judges directly by adopting the charge distribution.

The insulation board 14a, covering at least part of the conductive board body 111a, can be, but not limited to, an acrylic board or a glass board.

In practice, the control module 134a bases on a scan time to conduct alternately the multiplex module 132a and each of the touch portions 121a, 121a', 121a", 121a'", 121b, 121b', 121b" and 121b'" of any one of the plurality of touch pads 12a and 12b, such that the work voltage can be divided into a division voltage at the first node 1331a though the touch-pad capacitor C1 and the capacitor 133a.

For example, if the control module 134a conducts the multiplex module 132a and each of the touch portions 121a", 121a'", 121b" and 121b" of every one of the plurality of touch pads 12a and 12b at the first second (since the touch portions 121a", 121a'", 121b'" and 121b" are electrically coupled together, then they would be conducted at the same time), then the touch-pad capacitor C1 (formed by the touch portions 121a", 121a'", 121b'" and 121b" and the other four unlabeled touch portions) shown in FIG. 4 is generated. At the second second, the multiplex module 132a conducts with the touch portions 121a and 121a' of the touch pad 12a and the upper-left and upper-right touch portions of the touch pad under the touch pad 12a. However, in some other embodiments, the aforesaid conduction order might be different.

In the present invention, when an ion-contained liquid 2a on the insulation board 14a covers at least part of the conductive board body 111a and the touch portions 121a, 121a', 121b, 121b', 121a", 121a'", 121b" and 121b'" of one of the touch pads 12a and 12b (as shown in this second embodiment, the touch portion 121a of the touch pad 12a is bridged with the conductive board body 111a), a liquid-bridging capacitor C2 is faulted between the conductive board body 111a and one of the plurality of touch pads 12a and 12b by being in parallel with the touch-pad capacitor C1 so as to magnify the division voltage into a magnified division voltage. As the control module 134a determines that the magnified division voltage is larger than the voltage difference-judged value, then the control module 134a outputs an invalid touch signal.

Practically, while the liquid-bridging capacitor C2 is not formed, the division voltage at the first node 1331a is computed by Vcom×a/(a+b), in which the Vcom is the work voltage, the a is the capacitance of the touch-pad capacitor C1, and the b is the capacitance of the capacitor 133a.

As the liquid-bridging capacitor C2 is generated, since the liquid-bridging capacitor C2 with the capacitance c is in parallel with the touch-pad capacitor C1, then the division voltage at the first node 1331a would be computed by Vcom×(a+c)/(a+b+c) so as to produce the magnified division voltage (1.8V for example, the augmented voltage). Then, as the control module 134a judges that the magnified division voltage is larger than the voltage difference judged value (1.6V for example), then the invalid touch signal is outputted.

In addition, if a hand of user touches the touch pad 12a or 12b, the induced capacitor C3 is grounded and in parallel with the capacitor 133a, such that the voltage value can be reduced. Namely, in this embodiment of the present invention, the voltage difference judged value is the division voltage (not necessarily prevailing to the other embodiments). Thus, by observing the change of the division voltage (increase or decrease), it is easy to tell if or not there is an ion-contained liquid 2a (or water). More specifically, it can be told if the hand touch is performed in a watery environment. In practice, the division voltage corresponding to the hand touch increases if the water exists, but decreases if not.

In the present invention, while the hand touches at a place where the ion-contained liquid 2a exists, then, in order to judge if or not the hand touch occurs together with the existence of the ion-contained liquid 2a, proper ratio values can be applied. For example, the control module 134a can base on the magnified division voltage and the voltage difference-judged value to calculate a variation ratio, and then sees if or not the variation ratio reaches the ratio judged value.

For example, while in basing the magnified division voltage and the voltage difference-judged value to compute the variation ratio, if the voltage difference judged value is 2V, then the variation ratio would computed as (2−1.8)/2, i.e. 0.1. It implies that the variation ratio is 10%. Upon when the variation ratio reaches the ratio judged value (10% for example), the control module 134a would output a valid touch signal to tell that the hand touch involves the touch of the ion-contained liquid 2a.

In addition, though the first embodiment of the touch system for preventing water influence in accordance with the present invention applies the voltage oscillation wave to erase the capacitance effect of the liquid-bridging capacitor (for judging if or not the touch is invalid), yet the second embodiment of the touch system for preventing water influence in accordance with the present invention can judge (1) the existence of water, and (2) if the hand touch occurs with the existence of water by applying the variation ratio. However, practically, the first embodiment of the touch system for preventing water influence can be also applied to judge if the touch is invalid, by evaluating the variation ratio. On the other, the second embodiment of the touch system for preventing water influence can also apply the voltage oscillation wave to erase the aforesaid capacitance effect of the liquid-bridging capacitor. Thus, no matter whether the first embodiment or the second embodiment is applied, the determination of the relevant method for judging if or not the touch is valid depends mainly on practical requirements.

In summary, after providing the touch system for preventing water influence of the present invention, the induced capacitor caused by an accidental water drop on the touch pad can be erased by an equipotential manipulation, and also the determination upon whether the touch is a pure hand touch or a water touch can be sure by judging the corresponding division voltage. Thereupon, mis-touch at the IC chip so as further to execute unexpected functions can be thus avoided, and therefore the operability of the touch system can be substantially enhanced.

While the present invention has been particularly shown and described with reference to a preferred embodiment, it will be understood by those skilled in the art that various changes in form and detail may be without departing from the spirit and scope of the present invention.

What is claimed is:

1. A touch system configured for preventing water influence, comprising:
   a circuit board, having a conductive board body further including a plurality of configuration regions distributed in an arrangement direction;
   a plurality of touch pads, located on the circuit board in the corresponding configuration regions by being spaced with the conductive board body, a touch-pad capacitor being formed between the plurality of touch pads and the conductive board body after a work voltage is received, each of the touch pads including at least one touch portion;
   a control chip, mounted on the circuit board, further including:
      a work voltage-providing module, electrically coupled with the conductive board body, being to provide the work voltage to the conductive board body;
      a multiplex module, electrically coupled with the plurality of touch pads;
      a capacitor, having a first node and a second node, the first node being electrically coupled with the multiplex module, the second node being grounded; and
      a control module, electrically coupled with the multiplex module and the first node of the capacitor, having a voltage difference-judged value, being based on a scan time to conduct alternately between the multiplex module and the touch portion of each of the plurality of touch pads so as to have the work voltage to be divided into a division voltage at the first node through the touch-pad capacitor and the capacitor; and an insulation board, covering at least part of the conductive board body;

wherein, when an ion-containing liquid is on the insulation board by covering at least part of the conductive board body and the touch portion of one of the touch pads, a liquid-bridging capacitor is formed between the conductive board body and the one of the touch pads by being parallel with the touch-pad capacitor so as thereby to magnify the division voltage into a magnified division voltage;

wherein, if the control module judges that the magnified division voltage is larger than the voltage difference-judged value, the control module outputs an invalid touch signal.

2. The touch system of claim 1, wherein, as each said touch pad includes a plurality of the at least one touch portion, at least two of the touch portions of each said touch pad are electrically coupled together by a coupling wire, and further electrically coupled with the multiplex module.

3. The touch system of claim 2, wherein said at least two of the touch portions of each said touch pad are distributed diagonally.

4. The touch system of claim 1, wherein said at least one touch portion is one of a circle, an oval, a sector and a polygon.

5. The touch system of claim 1, wherein each one of the configuration regions is one of a circle region, an oval region, a sector region and a polygon region.

* * * * *